United States Patent
Shields et al.

[11] Patent Number: 6,087,724
[45] Date of Patent: Jul. 11, 2000

[54] HSQ WITH HIGH PLASMA ETCHING RESISTANCE SURFACE FOR BORDERLESS VIAS

[75] Inventors: Jeffrey A. Shields, Sunnyvale; Khanh Tran, San Jose; Robert Chen, Los Altos, all of Calif.; Robert Dawson, Austin, Tex.

[73] Assignee: Advanced Micro Devices, Inc., Sunnyvale, Calif.

[21] Appl. No.: 09/084,737

[22] Filed: May 27, 1998

Related U.S. Application Data

[63] Continuation-in-part of application No. 08/993,856, Dec. 18, 1997, abandoned.

[51] Int. Cl.$^7$ ............................ H01L 23/48; H01L 23/52; H01L 29/40
[52] U.S. Cl. ............................ 257/734; 257/750; 257/758; 257/759
[58] Field of Search ............................ 257/734, 750, 257/758–764; 438/787, 623

[56] References Cited

U.S. PATENT DOCUMENTS

| | | | |
|---|---|---|---|
| 5,607,773 | 3/1997 | Ahlburn et al. | 438/623 |
| 5,619,072 | 4/1997 | Mehta | 257/763 |
| 5,750,403 | 5/1998 | Inoue et al. | 438/787 |
| 5,818,111 | 10/1998 | Jeng et al. | 257/758 |

*Primary Examiner*—Minh Loan Tran
*Assistant Examiner*—Cuong Q Nguyen

[57] ABSTRACT

HSQ is employed for gap filling patterned metal layers. The surface of the deposited HSQ gap fill layer is modified to decrease its plasma etching rate. Embodiments include modifying the HSQ surface by exposure to a plasma, such as a nitrogen-containing plasma, e.g., a plasma containing ammonia or hydrogen/nitrogen, to form a nitrided surface region. Reduction of the plasma etching rate of HSQ enables formation of reliable low resistance borderless vias.

11 Claims, 4 Drawing Sheets

HSQ WITH HIGH PLASMA ETCHING RESISTANCE SURFACE FOR BORDERLESS VIAS

RELATED APPLICATIONS

This application is a continuation-in-part application of U.S. patent Application Ser. No. 08/993,856 filed on Dec. 18, 1997, the entire disclosure of which is incorporated herein by reference.

TECHNICAL FIELD

The present invention relates to a high density, multi-metal layer semiconductor device with reliable interconnection patterns. The invention has particular applicability in manufacturing high density multi-metal layer semiconductor devices with design features of 0.50 microns and under.

BACKGROUND ART

The escalating demands for high density and performance associated with ultra large scale integration semiconductor devices require design features of 0.50 microns and under, increased transistor and circuit speeds, high reliability and increased manufacturing throughput. The reduction of design features to 0.50 microns and under challenges the limitations of conventional interconnection technology, including conventional photolithographic, etching and deposition techniques.

Conventional methodology for forming patterned metal layers comprises a subtractive etching or etch back step as the primary metal patterning technique. Such a method involves the formation of a first dielectric layer on a semiconductor substrate, typically monocrystalline silicon, with conductive contacts formed therein for electrical connection with an active region on the semiconductor substrate, such as a source/drain region, or gate electrode. A metal layer, such as aluminum or an aluminum alloy, is deposited on the first dielectric layer, and a photoresist mask is formed on the metal layer having a pattern corresponding to a desired conductive pattern. The metal layer is then etched through the photoresist mask to form the conductive pattern comprising metal features separated by gaps, such as a plurality of metal lines with interwiring spacings therebetween. A dielectric layer is then applied to the resulting conductive pattern to fill in the gaps and the surface is planarized, as by conventional etching or chemical-mechanical polishing (CMP) planarization techniques.

As shown in FIGS. 1 and 2, conventional practices comprise depositing metal layer 11 on dielectric layer 10 which is typically formed on a semiconductor substrate containing an active region with transistors (not shown). After photolithography, etching is then conducted to form a patterned metal layer comprising metal features 11a, 11b, 11c and 11d with gaps therebetween. A dielectric material 12, such as spin on glass (SOG), is typically deposited to fill in the gaps between the metal features, and baked at a temperature of about 300° C. to about 450° C., for a period of time up to about two hours, depending upon the particular SOG material employed, to effect planarization. Planarization, as by CMP, is then performed.

As feature sizes, e.g., metal lines and interwiring spacings, shrink to 0.50 microns and below, such as 0.18 microns, it becomes increasingly difficult to satisfactorily fill in the interwiring spacings voidlessly and obtain adequate step coverage. It also becomes increasingly difficult to form a reliable interconnection structure. A through-hole is typically formed in a dielectric layer to expose an underlying metal feature, wherein the metal feature serves as a landing pad occupying the entire bottom of the through-hole. Upon filling the through-hole with conductive material, such as a metal plug to form a conductive via, the entire bottom surface of the conductive via is in direct contact with the metal feature. Such a conventional technique is illustrated in FIG. 3, wherein metal feature 30 of a first patterned metal layer is formed on first dielectric layer 31 and exposed by through-hole 32 formed in second dielectric layer 33. In accordance with conventional practices, through-hole 32 is formed so that metal feature 30 encloses the entire bottom opening, thereby serving as a landing pad for metal plug 34 which fills through-hole 32 to form conductive via 35. Thus, the entire bottom surface of conductive via 35 is in direct contact with metal feature 30. Conductive via 35 electrically connects metal feature 30 and metal feature 36 which is part of a second patterned metal layer. As shown in FIGS. 2 and 3, the side edges of a metal feature or conductive line, e.g., 30A, 30B, and 36A, and 36B, may taper somewhat as a result of etching.

The reduction of design features to the range of 0.50 microns and under requires extremely high interconnect density. The conventional practice of forming a landing pad completely enclosing the bottom surface of a conductive via utilizes a significant amount of precious real estate on a semiconductor chip which is antithetic to escalating high densification requirements. In addition, it is extremely difficult to voidlessly fill through-holes having such reduced dimensions because of the extremely high aspect ratio, i.e., height of the through-hole with respect to diameter of the through-hole. The resistance of the via rises rapidly with decreasing cross section, adding more incentive to make the via as large as feasible. Accordingly, conventional remedial techniques comprise purposely widening the diameter of the through-hole to decrease the aspect ratio. As a result, misalignment occurs wherein the bottom surface of the conductive via is not completely enclosed by the underlying metal feature. This type of via is called a "borderless via", which also conserves chip real estate.

The use of borderless vias, however, creates new problems. For example, as a result of misalignment, the SOG gap filling layer is penetrated by etching when forming a through-hole, due to the low density and poor stability of SOG. As a result of such penetration, moisture and gas accumulate thereby increasing the resistance of the interconnection. Moreover, spiking can occur, i.e., penetration of the metal plug to the substrate, causing a short. For example, adverting to FIG. 4, first dielectric layer 41 is formed on substrate 40 and a first metal pattern comprising a first metal feature, e.g., metal line 45, is formed on first dielectric layer 41. The intervening spacing gap is filled with SOG 42. Dielectric layer 43 is then deposited and a through-hole formed therein exposing a portion of the upper surface and at least a portion of a side surface of first metal feature 45 and exposing a portion of SOG 42. Upon filling the through-hole with a metallic plug 44, typically comprising an initial barrier layer (not shown) and tungsten, penetrates through to substrate 40, as a result of "spiking" which occurs during the via etch, thereby causing shorting.

Another problem generated by reducing the size of metal lines below about 0.50 microns is that it becomes increasingly difficult to voidlessly gap fill interwiring spacings with a dielectric material, such as SOG. Hydrogen silsesquioxane (HSQ) offers many advantages for use in interconnect patterns. HSQ is relatively carbon free, thereby avoiding poison via problems. In addition, HSQ exhibits excellent planarity and is capable of gap filling interwiring spacings less than 0.15 microns employing conventional spin-on equipment. HSQ undergoes a melting phase at approximately 200° C., but does not convert to the high dielectric constant glass phase until reaching temperatures of about 400° C. for intermetal applications.

However, the use of HSQ presents problems, particularly in borderless via applications. Typically, when forming a borderless via, plasma etching is conducted. However, it was found that the plasma etch rate of HSQ is considerably faster than traditional deposited oxides typically deposited on a dielectric gap fill layer, such as a silicon oxide derived from tetraethyl orthosilicate (TEOS) or from silane by plasma enhanced chemical vapor deposition (PECVD). Accordingly, during plasma etching to form a misaligned through-hole for a borderless via, the etch rate of the HSQ gap fill layer accelerates, thereby producing large trenches along the side surfaces of the metal lines. For example, adverting to FIG. 5 a first patterned metal layer comprising metal features 51A and 51B separated by gap 52 is formed on dielectric layer 50. A layer of HSQ 53 is deposited filling the gaps in the patterned metal layer. A layer of a dielectric material 54, such as silicon oxide derived from TEOS or silane, is deposited and planarized, as by CMP. A misaligned through-hole 55 is then formed in a conventional manner, after applying a photoresist mask and plasma etching. As shown in FIG. 5, misaligned through-hole 55 exposes a portion of the upper surface 151A of metal feature 51A and, due to the high plasma etching rate characteristics of HSQ, also exposes a major portion of the side surface 251A of metal feature 51A.

The formation of a large trench exposing a major portion of the side surface of a metal feature in forming a borderless via creates various problems, particularly during subsequent barrier metal deposition and contact plug fill. For example, it becomes increasingly difficult to deposit a barrier layer within high aspect ratio (height/width) openings, mandated by the reduction of design features to the range of 0.50 microns and under. A typical metal feature, such as features 51A and 51B, comprises a first lower metal layer of a refractory material such as tungsten or titanium, a primary intermediate metal layer such as aluminum or an aluminum alloy, and an upper anti-reflective coating which also serves as an etch stop. In forming a misaligned through-hole exposing a significant portion of the side surface 251A of metal feature 51A, undercutting would occur exposing a portion of the primary aluminum or aluminum alloy and rendering it very difficult to deposit a suitable conformal barrier layer material. Upon subsequent plug filling, as with tungsten from tungsten hexafluoride vapor, an undesirable interaction with aluminum sometimes occurs.

In copending application Ser. No. 08/951,592 filed on Oct. 16, 1997, a method is disclosed for restoring degradation of an HSQ film by exposure to an $H_2$-containing plasma to increase the number of Si—H bonds, decrease the number of Si—OH bonds, and decrease the propensity to absorb moisture. The disclosed treatment with an $H_2$-containing plasma enables the use of HSQ to gap fill metal lines and form borderless vias with improved reliability by reducing outgassing and, hence, void formation.

In copending application Ser. No. 08/924,131 filed on Sep. 5, 1997 (Our Docket No. 1033-350), a method is disclosed for depositing a titanium nitride barrier layer in a through-hole by chemical vapor deposition with subsequent plasma treatment in a plasma of hydrogen/nitrogen to decrease its carbon content.

In copending application Ser. No. 08/992,430 filed on Dec. 18, 1997, the etch rate of a deposited HSQ layer is decreased by selectively heating portions of the HSQ layer adjoining the upper and side surfaces of a lower conductive feature to increase the density and etching resistance vis-à-vis portions of the HSQ layer which do not adjoin the conductive feature.

There exists a need to form interconnection patterns having borderless vias employing HSQ as a gap fill layer with improved reliability and increased production throughput. There exists a particular need for improving the etching resistance of an HSQ gap fill layer to avoid exposing side surfaces of a lower metal feature, thereby forming interconnection patterns exhibiting improved reliability.

DISCLOSURE OF THE INVENTION

An advantage of the present invention is a method of manufacturing a high density, multi-metal layer semiconductor device with design features of 0.50 microns and under, and an interconnection pattern comprising borderless vias with high integrity.

Another advantage of the present invention is a high density, multi-metal layer semiconductor device with design features of 0.50 microns and under, and an interconnection pattern comprising high integrity borderless vias.

Additional advantages and other features of the present invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other advantages are achieved in part by a method of manufacturing a semiconductor device, which method comprises: forming a first conductive feature having an upper surface and side surfaces and depositing a layer of hydrogen silsesquioxane (HSQ) on the upper surface and side surfaces of the first conductive feature. The HSQ layer is then planarized so that an upper surface of the HSQ layer is substantially coplanar with the upper surface of the first conductive feature. The HSQ layer has a first plasma etching rate and upper surface. The upper surface of the HSQ layer is treated in a plasma to decrease the plasma etching rate of the HSQ upper surface to a second plasma etching rate.

Another aspect of the present invention is a semiconductor device comprising a multi-level interconnection pattern having: a first conductive feature comprising an upper surface and side surfaces; and a layer of hydrogen silsesquioxane (HSQ) on the upper surface and side surfaces of the first conductive feature, the HSQ layer having a first plasma etching rate and an upper surface having a second plasma etching rate less than the first plasma etching rate.

Additional advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 1:
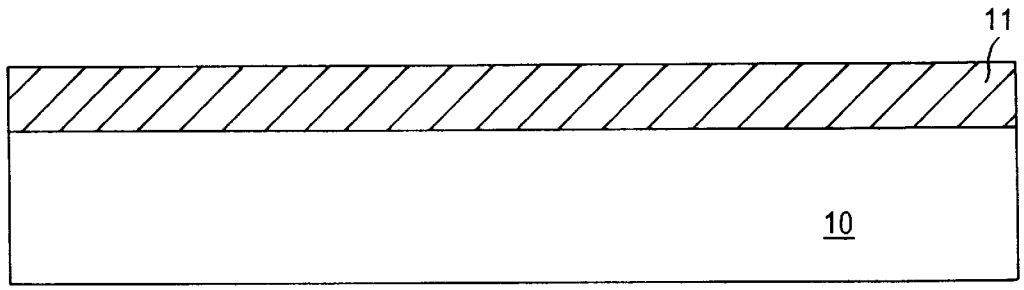
FIGS. 1 and 2 schematically illustrate conventional methodology in gap filling a patterned metal layer.
Figure 2:
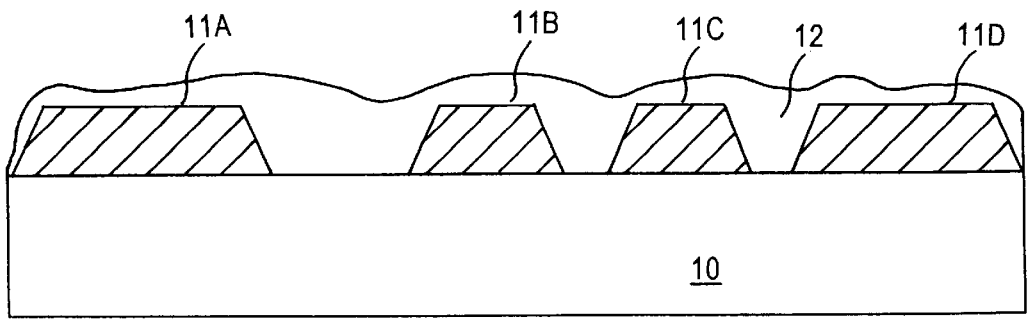
Figure 3:
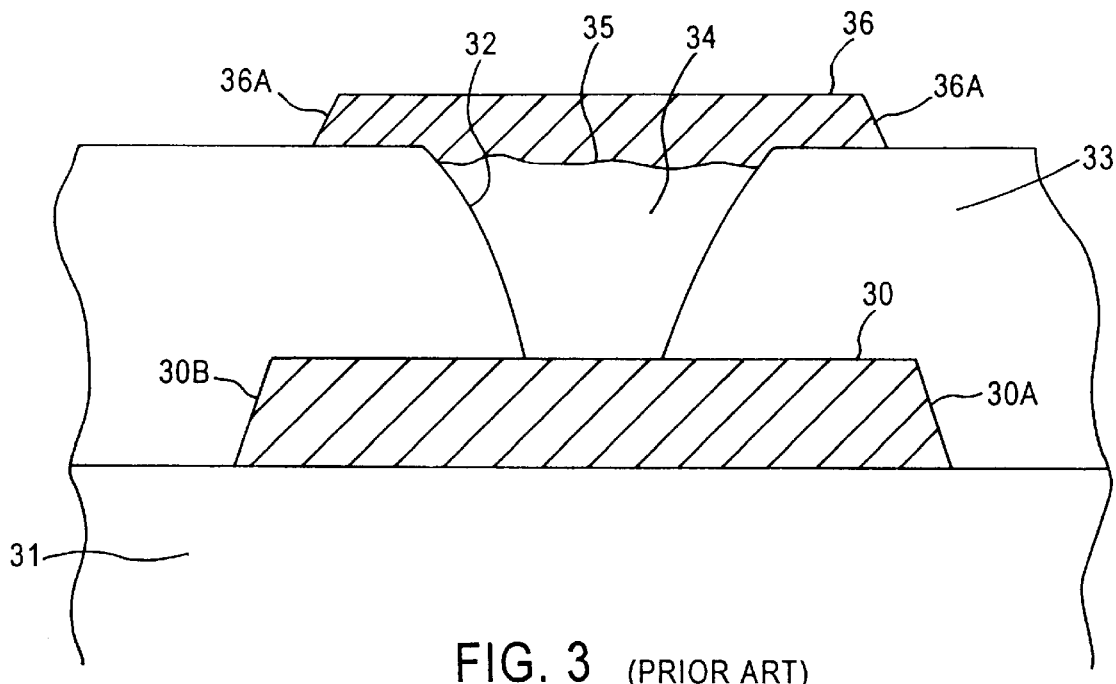
FIG. 3 schematically illustrates a conventional metal plug via interconnection.
Figure 4:
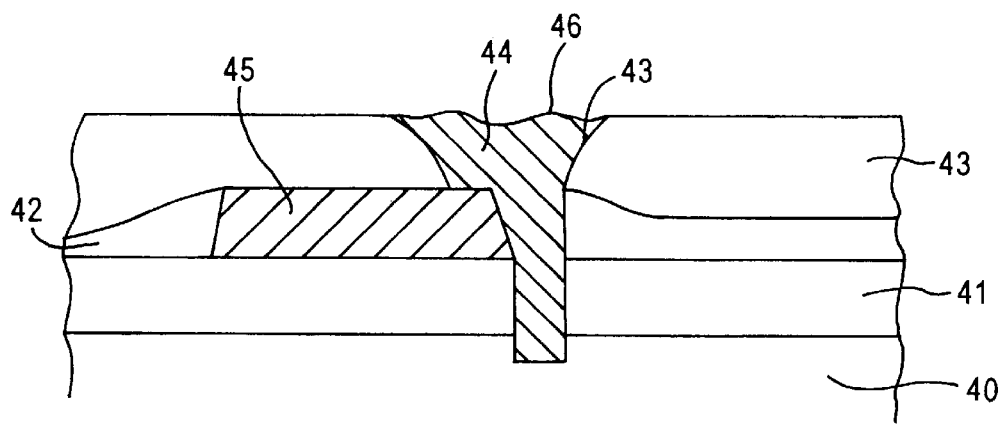
FIG. 4 schematically illustrates spiking in a borderless via.

The present invention enables the use HSQ to fill gaps in patterned metal layers and form highly reliable interconnections, including interconnections containing borderless vias, particularly in multi-metal layer semiconductor devices having design features of about 0.50 microns and under. In accordance with the present invention. An HSQ gap fill layer is deposited on a patterned conductive layer and then planarized, as by CMP, so that its upper surface is substantially coplanar with the upper surfaces of the conductive features. The upper surface of the deposited HSQ gap fill layer is then modified to increase its resistance to plasma etching, i.e., decrease its plasma etching rate with respect to plasma etching a misaligned through-hole for a borderless via. Embodiments of the present invention comprise reducing the plasma etching rate of the surface of a deposited HSQ gap fill layer by exposing the HSQ surface to a plasma. Aspects of this embodiment comprise exposing the surface of the deposited HSQ gap fill layer to a nitrogen-containing plasma, such as a plasma containing ammonia or a forming gas comprising about 8 to about 12 atomic % hydrogen and the balance nitrogen. In addition, mixtures of hydrogen and nitrogen with a hydrogen concentration between about 4 to about 50% atomic % can be employed.

Treatment of the upper surface of a deposited HSQ gap fill layer in a nitrogen-containing plasma results in the formation of a nitrided surface portion extending into the HSQ gap fill layer, which nitrided portion has a plasma etching rate sufficiently less than the plasma etching rate of the remaining portion of the HSQ gap fill layer to significantly reduce the depth of the throughhole for the borderless via penetrating the HSQ layer along the side surface of the lower metal feature. The precise parameters for treating the upper surface of the deposited HSQ gap fill layer in a nitrogen-containing plasma can be optimized in a particular situation to sufficiently reduce the plasma etching rate to avoid exposing a significant portion of the side surface of the lower metal feature when forming a misaligned throughhole. For example, it was found suitable to treat a deposited HSQ gap fill layer in a plasma containing ammonia or hydrogen/nitrogen at a temperature of about 250° C. to about 350° C. to form a nitrided surface area extending into the HSQ layer up to about 100 Å.

The precise mechanism involved in altering the surface portion of the HSQ layer to reduce its plasma etching rate by exposure to a plasma is not known with certainty. However, it is believed that the nitrided surface portion exhibits a higher density and, hence, a lower plasma etching rate than the remaining portion of the HSQ layer which has not been nitrided. An increase in HSQ density is accompanied by an increase in its dielectric constant. Accordingly, in a particular situation, the extent of the nitrided portion is minimized consistent with the objective of preventing exposure of a significant portion of the side surface of the lower metal feature, while avoiding an increase the overall dielectric constant of the HSQ gap fill layer to an undesirable extent. For example, the dielectric constant of the as-deposited HSQ gap fill layer is typically under 4, e.g., 3 to about 3.3. However, upon treatment in a nitrogen-containing plasma, the treated nitrided surface portion typically has a dielectric constant greater than 4, e.g., about 4 to about 4.2. Accordingly, in embodiments of the present invention, it is advantageous to reduce the depth to which the nitrided surface portion extends into the deposited HSQ gap filling layer to no more than about 100 Å.

Figure 6A:
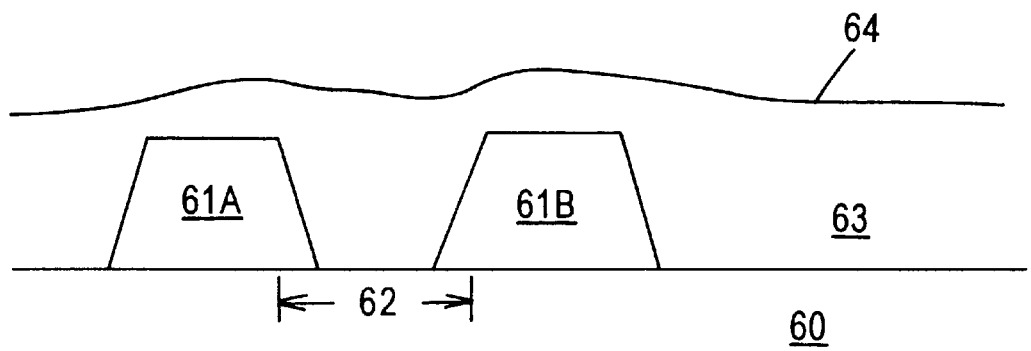
FIG. 6A schematically illustrates an intermediate step in an embodiment of the present invention prior to planarization.
Figure 6B:
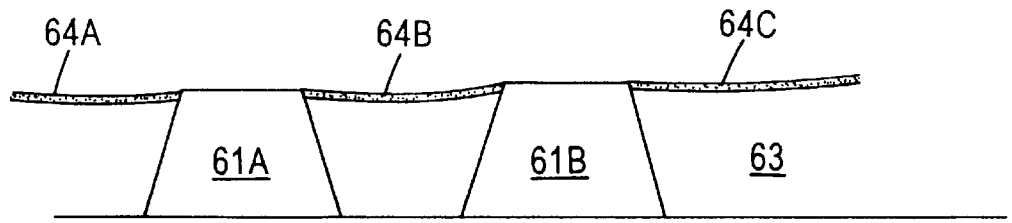
FIG. 6B schematically illustrates an embodiment of the present invention.
Figure 7:
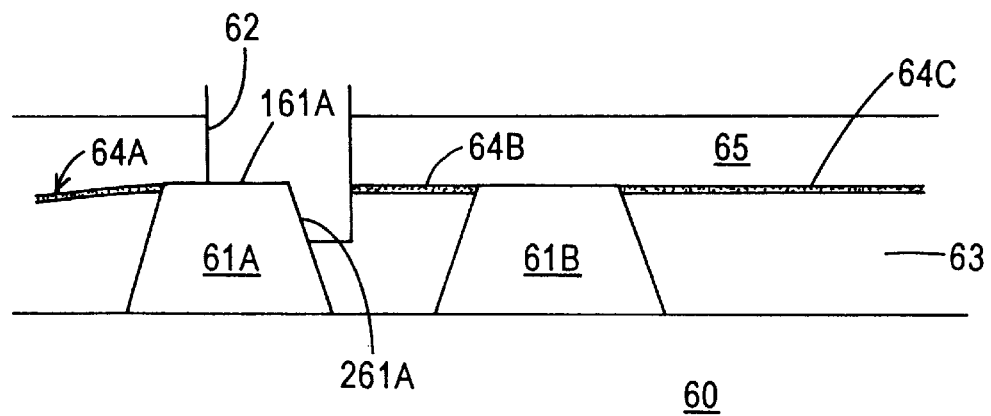
FIG. 7 schematically illustrates a through-hole for a borderless via formed in accordance with an embodiment of the present invention.

An embodiment of the present invention is illustrated in FIGS. 6A, 6B and 7. Adverting to FIG. 6A, a first conductive pattern, e.g., a metal pattern comprising metal features 61A and 61B, is formed on dielectric layer 60 separated by gap 62. Typically, the pattern metal layer comprises a first refractory layer, such as tungsten or titanium, a second primary conductive layer such. as aluminum or aluminum alloy, and an anti-reflective coating such as titanium nitride. For metal features of about 0.50 microns, gap 62 typically extends about 0.375 microns. A layer of HSQ 63 is then deposited to fill the gaps on the patterned metal layer, including gap 62. HSQ layer 63 can be deposited by a conventional spin on technique. As shown in FIG. 6B, the deposited HSQ layer is planarized, as by CMP, so that its top surface is substantially coplanar with the top surface of the metal features 61A and 61B.

In accordance with the embodiments of the present invention, the upper surface of deposited HSQ gap fill layer 63 is modified to reduce its plasma etching rate with respect to subsequent conventional plasma etching to form a misaligned through-hole for a borderless via. Embodiments of the present invention comprise exposing the surface of HSQ gap fill layer 63 to a nitrogen-containing plasma, such as a plasma containing a forming gas comprising equal parts by volume of hydrogen and nitrogen. Exposure of the surface of HSQ gap filling layer 63 to a nitrogen-containing plasma, results in the formation of a nitrided surface portions 64A, 64B and 64C having a lower plasma etching rate than the remaining nitrided portion of HSQ gap fill layer 63.

Figure 5:
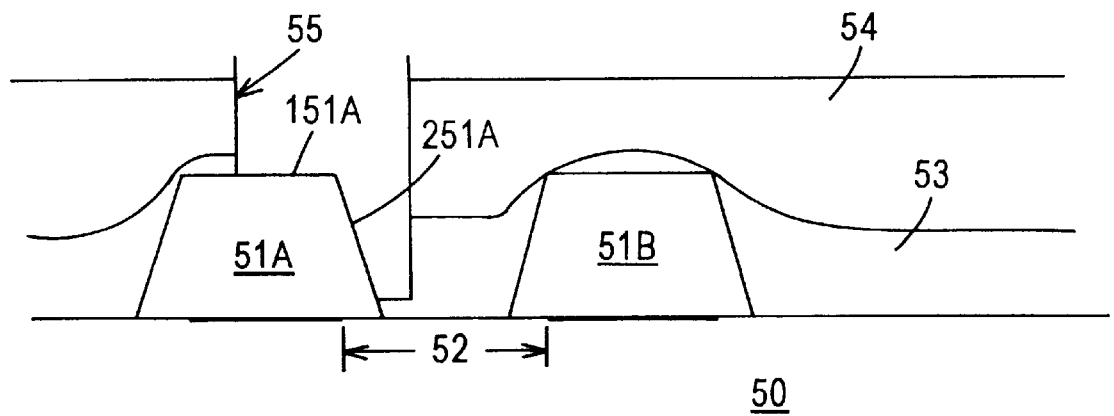
FIG. 5 schematically illustrates the formation of a large through-hole by plasma etching an HSQ gap fill layer.

Subsequent to modifying the upper surface of HSQ gap filling layer 63, a dielectric layer 65 is deposited, such as a silicon oxide derived from TEOS or silane by PECVD, as illustrated in FIG. 7. A misaligned through-hole 62 for a borderless via is then formed through dielectric layer 65 exposing a portion of the upper surface 161A and a portion of the side surface 261A of metal feature 61A. Due to the lower plasma etching rate of surface portion 64 of HSQ gap fill layer 63, the amount of the side surface 261A exposed in forming misaligned through-hole 62 by plasma etching is reduced considerably vis-à-vis the side portion 251A of metal feature 51A depicted in FIG. 5. The reduction in the amount of side surface 261A of metal feature 61A exposed affords considerable advantages, such as improved via reliability when filled with conductive materials 66 as shown in FIG. 7. By reducing the amount of side surface 261A of lower metal feature 61 exposed during formation of the through-hole for the borderless via, undercutting of the side surface 261A is reduced and, hence, barrier metal deposition is facilitated, thereby reducing or eliminating void formation, outgassing and adverse interaction between tungsten and aluminum.

In forming borderless vias in accordance with the present invention, the conductive materials 66 (FIG. 7) typically comprises a composite of a barrier layer which serves as an adhesion promoter for subsequently deposited tungsten. The adhesion promoting layer can comprise a refractory metal typically employed from improving the adhesion of tungsten to the underlying aluminum or aluminum alloy feature. Such a refractory material can be titanium, titanium nitride, titanium-tungsten or titanium-titanium nitride.

Titanium-titanium nitride can be sputter deposited, while titanium nitride can be deposited by CVD as disclosed in copending application Ser. No. 08/924,131, filed on Sep. 5, 1997 (Our Docket No. 1033-350). Embodiments of the present invention include forming a composite patterned metal layer comprising an initial tungsten layer, and intermediate layer comprising aluminum or an aluminum alloy, and an upper anti-reflective coating/etch stop layer, such as titanium-titanium nitride.

After completion of the conductive via, a second patterned layer is formed on dielectric layer 65 (not shown) comprising a metal feature electrically connected to underlying metal feature 61A through the borderless via. The process is then repeated by gap filling the second pattern metal layer employing HSQ and surface treating the deposited HSQ in accordance with the present invention, until the desired number of patterned metal layers are formed and gap filled.

The present invention is applicable to the production of various types of semiconductor device, particularly high density, multi-metal patterned layers with submicron features, particularly submicron features of about 0.50 microns and below, exhibiting high speed characteristics and improved reliability. The present invention enables the advantageous use of HSQ to gap fill patterned metal layers with sufficiently reduced penetration when forming a misaligned through-hole for a borderless via, by increasing the plasma etching resistance surface of the HSQ gap fill layer. The present invention is cost effective and can easily be integrated into conventional processing equipment.

In carrying out the embodiments of the present invention, the metal layers can be formed of any metal typically employed in manufacturing semiconductor devices, such as aluminum, aluminum alloys, copper, copper alloys, gold, gold alloys, silver, silver alloys, refractory metals, refractory metal alloys, and refractory metal compounds. The metal layers of the present invention can be formed by any technique conventionally employed in the manufacture of semiconductor devices. For example, the metal layers can be formed by conventional metallization techniques, such as various types of CVD processes, including low pressure chemical vapor deposition (LPCVD), and plasma enhanced chemical vapor deposition (PECVD). Normally, when high melting metal point metals such as tungsten are deposited, CVD techniques are employed. Low melting point metals, such as aluminum and aluminum-base alloys, including aluminum-copper alloys, can also be deposited by melting, sputtering, or physical vapor deposition (PVD).

In the previous descriptions, numerous specific details are set forth, such as specific materials, structures, chemicals, processes, etc., in order to provide a thorough understanding of the present invention. However, the present invention can be practiced without resorting to the details specifically set forth. In other instances, well known processing structures have not been described in detail in order not to unnecessarily obscure the present invention.

Only the preferred embodiment of the invention and an example of its versatility are shown and described in the present disclosure. It is to be understood that the invention is capable of use in various other combinations and environments and is capable of changes or modifications within the scope of the inventive concept as expressed herein.

What is claimed is:

1. A semiconductor device comprising a multi-level interconnection pattern having:
   a first conductive feature comprising an upper surface and side surfaces; and
   a layer of hydrogen silsesquioxane (HSQ) on the upper surface and side surfaces of the first conductive feature, the HSQ layer having a first plasma etching rate and an upper surface portion of the HSQ layer having a second plasma etching rate less than the first plasma etching rate, wherein the upper surface portion of the HSQ layer comprises a nitrided portion having the second plasma etching rate and the nitrided portion extends into the HSQ layer up to about 100 angstroms.

2. The semiconductor device according to claim 1, wherein the nitride portion is formed by exposure of the HSQ upper surface to a nitrogen-containing plasma.

3. The semiconductor device according to claim 1, wherein the first conductive feature is a metal feature and is part of a first metal pattern having gaps.

4. The semiconductor device according to claim 3, wherein the metal features have a size of about 0.50 microns and the gaps extend about 0.375 microns.

5. The semiconductor device according to claim 3, wherein, the HSQ layer fills the gaps; the semiconductor device further comprising a dielectric layer deposited on the HSQ layer.

6. The semiconductor device according to claim 5, wherein the dielectric layer comprises a silicon oxide derived from tetraethyl orthosilicate or silane by plasma enhanced chemical vapor deposition.

7. The semiconductor device according to claim 5, wherein the dielectric layer comprises a through-hole penetrating into the HSQ layer exposing a portion of the upper surface and a portion of a side surface of the first metal feature; and
   conductive material filling the through-hole forming a borderless via.

8. The semiconductor device according to claim 7, wherein the conductive layer filling the through-hole is a composite comprising a first conductive barrier layer which acts as an adhesion promoter for the second conductive layer.

9. The semiconductor device according to claim 8, wherein the first conductive layer comprises titanium, titanium nitride, titanium-tungsten or titanium-titanium nitride, and the second conductive layer comprises tungsten.

10. The semiconductor device according to claim 9, further comprising a second patterned metal layer on the dielectric layer, wherein the second patterned metal layer comprises a second metal feature electrically connected to the first metal feature by the borderless via.

11. The semiconductor device according to claim 3, wherein the first metal feature is a composite comprising a lower refractory layer, an intermediate layer comprising aluminum or an aluminum alloy and an upper anti-reflective coating.

* * * * *